United States Patent [19]

Blauschild

[11] 4,346,344

[45] Aug. 24, 1982

[54] STABLE FIELD EFFECT TRANSISTOR VOLTAGE REFERENCE

[75] Inventor: Robert A. Blauschild, Los Altos, Calif.

[73] Assignee: Signetics Corporation, Sunnyvale, Calif.

[21] Appl. No.: 10,195

[22] Filed: Feb. 8, 1979

[51] Int. Cl.³ ............................................. G05F 3/08
[52] U.S. Cl. ................................. 323/313; 323/316; 323/907; 307/304; 357/41
[58] Field of Search ............... 323/22 R, 19, 311, 313, 323/315, 316, 907; 307/297, 304; 357/20, 41

[56] References Cited

U.S. PATENT DOCUMENTS 3,975,648  8/1976  Tobey, Jr. et al. ............ 323/22 R X
4,068,134  1/1978  Tobey, Jr. et al. ............ 307/304 X
4,096,430  6/1978  Waldron ........................ 323/22 R
4,100,437  7/1978  Hoff, Jr. ...................... 323/22 R X Primary Examiner—William M. Shoop
Assistant Examiner—Peter S. Wong
Attorney, Agent, or Firm—Thomas A. Briody; Robert T. Mayer; Algy Tamoshunas

[57] ABSTRACT

A temperature stable voltage reference utilizes an enhancement field effect transistor and a depletion field effect transistor each connected in series with a current source. A differential amplifier has its input terminals separately connected between each of the field effect transistors and their respective current supplies. An input terminal of the field effect transistor is utilized as the reference voltage and is also connected to the gate of one of the field effect transistors, the gate of the other field effect transistor being connected to a reference potential.

5 Claims, 4 Drawing Figures

STABLE FIELD EFFECT TRANSISTOR VOLTAGE REFERENCE

BACKGROUND OF THE INVENTION

The invention relates to a temperature stable semiconductor reference voltage source.

DESCRIPTION OF THE PRIOR ART

Stable field effect transistor reference voltage supplies are generally fabricated by utilizing a pair of transistors that have a single parameter difference in their operating characteristics where that parameter produces a difference in voltage at one of the transistor terminals when the two transistors are operated under similar operating conditions.

U.S. Pat. No. 4,100,437 to Hoff, Jr., issued July 11, 1978 is an example of such a prior art reference. In Hoff Jr., the source/drain path of an enhancement mode field effect transistor and a depletion mode field effect transistor are each connected in series with a separate current source between a supply voltage and ground. The gates of both transistor are commonly connected between one of the transistors and its associated current source. The reference voltage is provided by a tap between the other transistor and its associated current source.

Another way in which a reference voltage may be created using a somewhat different type of field effect transistor is shown in U.S. Pat. No. 3,975,648 to Tobey, Jr., et al. In the Tobey Jr. patent two insulated gate field effect transistors that are substantially identical except for their flat-band voltage characteristics have their source/drain paths connected in a manner similar to that of Hoff Jr., but connect the inputs of a differential amplifier between the source/drain paths of the two transistors and their respective current sources. The gate terminal of one of the Tobey Jr., transistors is grounded, while the gate terminal of the other transistor is connected to the output of the differential amplifier. The stable voltage from the device is also provided by the output of the differential amplifier.

SUMMARY OF THE INVENTION

The invention provides an improvement in the temperature stability of the prior art devices described above by adjusting the relative dimensions between the channel width and gate length of the two transistors. In my device an enhancement moe field effect transistor and a depletion mode field effect transistor are connected through separate current sources to a voltage supply. As in the Tobey Jr., patent the inputs of a differential amplifier are connected between the drain/source paths of the transistors and their respective current sources. The gate of one of the transistors is grounded, while the output of the differential amplifier is connected to the gate of the other transistor and provides the stable reference voltage. The ratios of the channel width to gate length of the two transistors are adjusted in their manufacture so that a very low temperature drift results. The ratio of channel width to gate length of the depletion field effect transistor is adjusted so that it is approximately equal to the ratio of the channel width to gate length of the enhancement mode field effect transistor multiplied by $U_E/U_D$.

DETAILED DESCRIPTION OF THE PREFERRED EMBODIMENTS

Figure 1:
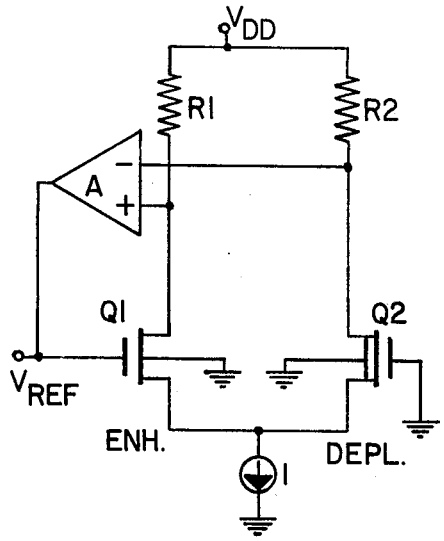
FIG. 1 is a schematic diagram of a first embodiment of the invention.
Figure 2:
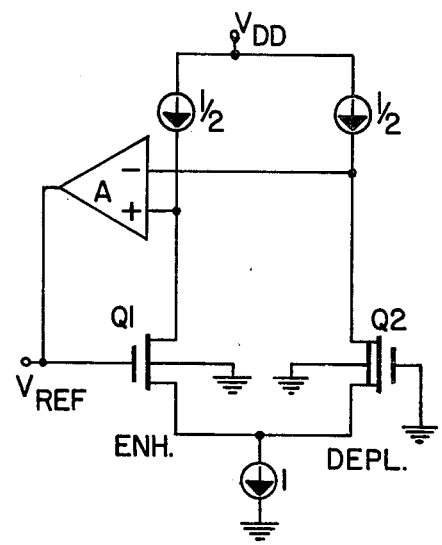
FIG. 2 is a schematic diagram of a second embodiment of the invention.

FIG. 1 shows an enhancement field effect transistor Q1 and a depletion mode field effect transistor Q2, each connected through respective resistors R1, R2 to a voltage source $V_{DD}$ a differential amplifier A has its input terminals connected to the junctions between the transistors and their respective resistors. Resistors R1 and R2 are of equal values. The output of operational amplifier A is connected to the gate terminal of the enhancement mode field effect transistor Q1, while the gate of the depletion mode field effect transistor Q2 is grounded. The output of the operational amplifier A is also utilized as the temperature stable reference voltage $V_{REF}$. The characteristics of the transistors Q1 and Q2 are virtually identical with the exception of the difference between the gate-source voltages created by a depletion implant in the depletion mode transistor. The operational amplifier A is connected in a negative feedback configuration that tends to force transistor Q1 to operate with the same drain/source voltage and current as Q2.

The current through each transistor is given by $ku-C_{ox}(V_{gs}-V_t)^2$, where k is equal to a process constant multiplied by the aspect ratio (W/L) of the device; u is equal to the channel mobility; $C_{ox}$ is equal to the gate oxide capacitance; $V_{gs}$ is equal to the gate-source voltage; and $V_t$ is equal to the threshold voltage.

The reference voltage output of the differential amplifier A is equal to the difference between the gate source voltages of the two transistors.

Put in another way the reference voltage $$V_{REF} = V_{TE} + \sqrt{\frac{I}{k_E u_E c_{OX}}} - V_{TD} - \sqrt{\frac{I}{k_D u_D c_{OX}}},$$

where subscripts E and D refer to enhancement and depletion parameters respectively.

If the drain current for the devices is supplied by depletion mode current sources than equation 3 becomes $$V_{REF} = V_{TE} - V_{TD} + V_{TD}\sqrt{\frac{k_L u_D}{k_E u_E}} - \sqrt{\frac{k_L}{k_D}},$$

where the subscript L refers to the depletion current sources.

It can be shown that the temperature range of the threshold voltage varies linear with the temperature as follows:

$$V_T = V_{TO} - \alpha T,$$

where $V_{TO}$ and $\alpha$ are constants that depend on the substrate dopant density and on the implant dosages used during processing. A discussion of the manner in which these constants may be determined is found in Penney, W. M., "MOS Integrated Circuits", Van Nostrand Co., pages 55–75, 1972. During the manufacture of the transistors, the processing steps are virtually identical until the final implant.

In order to obtain a very low temperature drift according to the invention, after the geometry of the enhancement transistor is chosen the optimum geometry of the depletion device is determined so that the drift is equal to:

$$\frac{dV_{REF}}{dT} = -\alpha_E + \alpha_D \left[ 1 - \sqrt{\frac{K_L}{K_E} \frac{U_D}{U_E}} + \sqrt{\frac{K_L}{K_D}} \right]$$

If the drift is set so that it is equal to zero the ratio of the channel width to gate length of the depletion device is equal to the ratio of the channel width to gate length of either of the current source load transistors Q3 or Q4 multiplied by the square of the inverse of $$\sqrt{\frac{K_L U_D}{K_E U_F}} + \frac{\alpha_E}{\alpha_D} - 1$$

Figure 3:
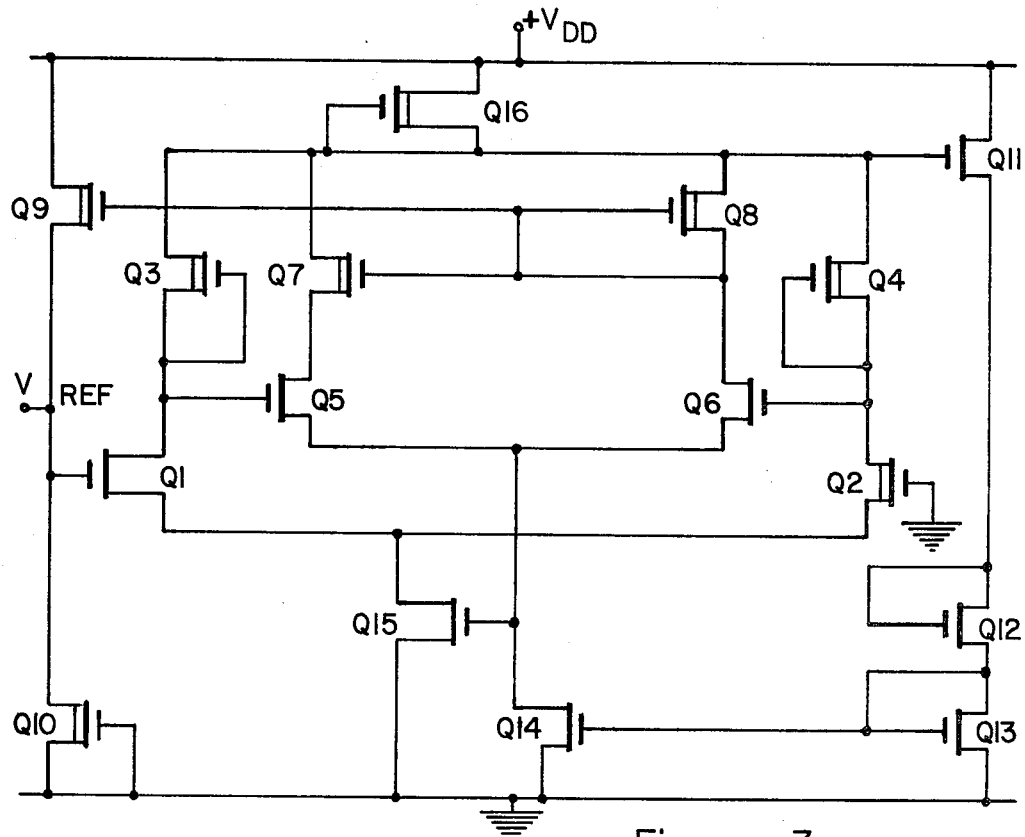
FIG. 3 is a schematic diagram of a preferred embodiment of my invention.

In FIG. 3 a practical realization of the reference circuit is shown. As in FIG. 1, transistors Q1 and Q2 are the enhancement and depletion transistors on which the operation of the reference voltage source is based. Transistors Q3 and Q4, connected in series with transistor Q1 and Q2 operate as current sources to replace resistors R1 and R2 of FIG. 1. The gate terminals of field effect transistors Q5 and Q6 are connected between transistors Q1 and Q3, and transistors Q2 and Q4, forming an input to the differential amplifier A of FIG. 1. Transistors Q7 and Q8 in series with transistors Q5 and Q6 complete the differential amplifier stage. The output of differential amplifier Q5-Q8 is connected back to the gate terminal of transistor Q1 by a source follower amplifier Q9, Q10. Transistors Q7 and Q8 are connected in such a manner that equal currents through these devices yield equal drain-source voltages for Q5 and Q6. The balance of the differential amplifier A is thereby improved. Transistor Q16 is connected as a current source for transistors Q7 and Q8 and is designed to provide a current equal to twice the sum of the currents through the drain terminals of transistors Q3 and Q8. The loop gain of the feedback system including transistors Q1 through Q10 should be large enough to yield proper load regulation. In general, a 40 dB gain is considered sufficient. Q11 has its gate terminal connected to the drain of Q16 in order to sense fluctuations in the supply voltage to transistors Q3, Q4, Q7 and Q8. Fluctuations in the voltage on the gate Q11 are converted into voltage fluctuations on the source of transistor Q13 and control the current flow through the above-mentioned transistors through transistors Q14 and Q15. Transistors Q11 through Q15 thereby constitute common-mode bias loops that provide feedback to insure that all depletion current sources operate in the saturated region. Since all of the voltages and currents depend only on the current source Q16 and the geometries of the individual devices transistors Q11 through Q16 thereby also serve to reject fluctuations in the supply voltage VDD.

In the event a selectable voltage reference is desired a potentiometer may be connected in parallel with transistor Q10. The tap of the potentiometer would be connected to the gate terminal of transistor Q2 instead of the ground connection shown in FIG. 3.

Figure 4:
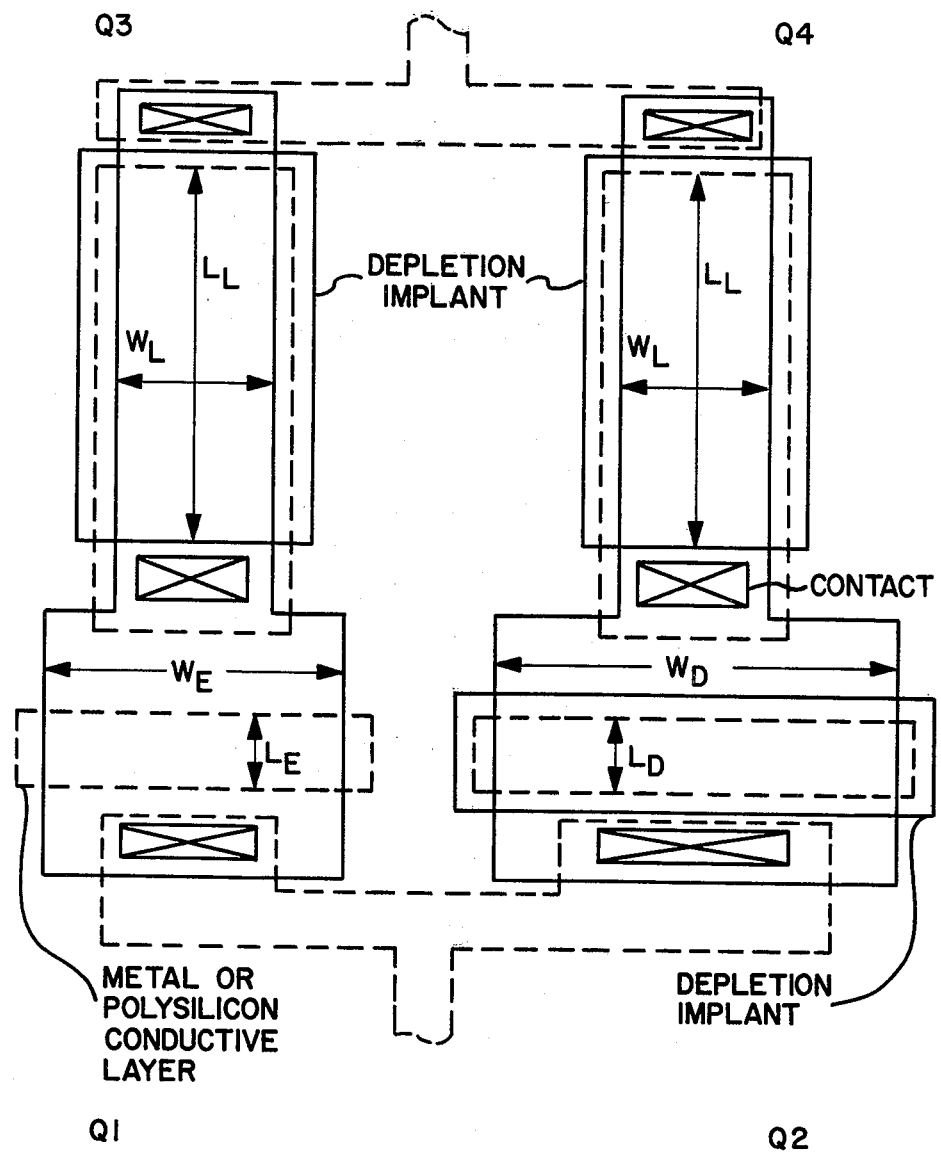
FIG. 4 is an integrated circuit layout corresponding to the four transistors Q1-Q4, inclusive, shown in FIG. 3.

FIG. 4 is an integrated circuit layout showing the width and length dimensions of channels and gates of the transistors Q1, Q2, Q3, and Q4.

I claim:

1. A stable voltage reference comprising an enhancement field effect transistor, a depletion field effect transistor, a separate means connected in series with the drain-source terminals of each of said field effect transistors for limiting the flow of current therethrough, a differential amplifier provided with a first input connected between the enhancement field effect transistor and the current limiting means connected thereto and provided with a second input connected between the depletion field effect transistor and the current limiting means connected thereto, means connecting the gate of one of said field effect transistors to a reference potential, and means connecting the output of said differential amplifier to the gate of the other of said field effect transistors, said depletion field effect transistor being provided with a depletion implant sufficient to generate a difference in gate-source voltages between said field effect transistors under identical drain-source current conditions, and the geometric ratios of the width of the channels and the length of the gates of said field effect transistors being sufficient to substantially eliminate temperature drift.

2. A stable voltage reference as recited in claim 1, wherein each of said current flow limiting means comprises a constant current source.

3. A stable voltage reference as recited in claim 2 wherein both of the constant current sources are substantially identical field effect transistors.

4. A stable voltage reference as recited in claim 1, wherein the ratio of the width of the channel to the length of the gate of said depletion mode field effect transistor is approximately equal to the ratio of the width of the channel to the length of the gate of the enhancement mode field effect transistor multiplied by $U_E/U_D$ where U is equal to the channel mobility and E and D refer to the enhancement and depletion parameters respectively.

5. A stable reference as recited in claim 3, wherein the ratio of the width of the channel to the length of the gate of the depletion mode field effect transistor is equal to the ratio of the width of the channel to the length of gate of the corresponding constant current source field effect transistor multiplied by the square of the inverse of $$\sqrt{\frac{K_L U_D}{K_E U_E}} + \frac{\alpha_E}{\alpha_D} - 1,$$

where K is equal to a process constant multiplied by the ratio of the channel width to gate length of the device, U is equal to the channel mobility, $\alpha$ is a constant that depends on substrate dopent density and on the implant dosages used during processing, and E and D refer to the enchancement and depletion device parameters respectively.

* * * * *